United States Patent
Yang et al.

(10) Patent No.: US 10,622,985 B2
(45) Date of Patent: Apr. 14, 2020

(54) SQUARE WAVE GENERATING METHOD AND SQUARE WAVE GENERATING CIRCUIT

(71) Applicant: Shenzhen Goodix Technology Co., Ltd., Shenzhen, Guangdong (CN)

(72) Inventors: Fu-Chiang Yang, Taipei (TW); Meng-Ta Yang, Taipei (TW)

(73) Assignee: Shenzhen Goodix Technology Co., Ltd., Shenzhen, Guangdong (CN)

(*) Notice: Subject to any disclaimer, the term of this patent is extended or adjusted under 35 U.S.C. 154(b) by 0 days.

(21) Appl. No.: 16/154,736

(22) Filed: Oct. 9, 2018

(65) Prior Publication Data
US 2019/0044507 A1 Feb. 7, 2019

Related U.S. Application Data
(63) Continuation of application No. PCT/CN2017/074531, filed on Feb. 23, 2017.

(51) Int. Cl.
*H03K 3/00* (2006.01)
*H03K 17/06* (2006.01)
*H03K 4/02* (2006.01)
*H03K 17/0814* (2006.01)

(52) U.S. Cl.
CPC ............ *H03K 17/063* (2013.01); *H03K 4/02* (2013.01); *H03K 17/0814* (2013.01)

(58) Field of Classification Search
CPC ............ H03K 17/063; H03K 17/0814; H03K 17/0822; H03K 17/04123; H03K 4/02; H03K 3/55; H03K 3/57; H03K 3/53; H03K 3/78; H03K 5/01
See application file for complete search history.

(56) References Cited

U.S. PATENT DOCUMENTS

| 6,249,169 B1 | 6/2001 | Okada | |
|---|---|---|---|
| 2012/0064952 A1 | 3/2012 | Iijima | |
| 2013/0029614 A1* | 1/2013 | Cho | H04B 1/48 455/83 |

FOREIGN PATENT DOCUMENTS

| CN | 104022676 A | 9/2014 |
|---|---|---|
| CN | 105391428 A | 3/2016 |
| CN | 205693641 U | 11/2016 |
| EP | 1 643 645 A1 | 4/2006 |

* cited by examiner

*Primary Examiner* — Long Nguyen
(74) *Attorney, Agent, or Firm* — Winston Hsu

(57) ABSTRACT

The present application provides a square wave generating method, applied in a square wave generating circuit, configured to generate a mimetic square wave signal, wherein the square wave generating circuit has a breakdown voltage. The square wave generating method comprises the square wave generating circuit generating the mimetic square wave signal as a first voltage during a first time interval; the square wave generating circuit generating the mimetic square wave signal as a second voltage during a second time interval; and the square wave generating circuit generating the mimetic square wave signal as a transient voltage during a transient interval between the first time interval and the second time interval, wherein the transient voltage is between the first voltage and the second voltage; wherein a first voltage difference between the first voltage and the second voltage is greater than the breakdown voltage.

20 Claims, 10 Drawing Sheets

US 10,622,985 B2

SQUARE WAVE GENERATING METHOD AND SQUARE WAVE GENERATING CIRCUIT

CROSS REFERENCE TO RELATED APPLICATIONS

The present application is a continuation of international application No. PCT/CN2017/074531, filed on Feb. 23, 2017, which is incorporated herein by reference in its entirety.

FIELD OF THE INVENTION

The present application relates to a square wave generating method and a square wave generating circuit, and more particularly, to a square wave generating method and a square wave generating circuit capable of generating high voltage amplitude and being manufactured by a low breakdown voltage manufacturing process.

BACKGROUND

For some specific circuitry, a square wave with high voltage amplitude may be required. To generate the square wave with high voltage amplitude, a high breakdown voltage semiconductor manufacturing process is required to manufacture semiconductor component with high breakdown voltage. However, the cost of the high breakdown voltage semiconductor manufacturing process is high, such that the manufacturing cost of electronic products using the specific circuitry stated in the above is increased.

Therefore, how to utilize a semiconductor device manufactured by a low breakdown voltage manufacturing process to generate a square ware with high voltage amplitude is a significant objective in the field.

SUMMARY

It is therefore a primary objective of the present application to provide a square wave generating method and a square wave generating circuit capable of generating high voltage amplitude and being manufactured by a low breakdown voltage manufacturing process, to improve over disadvantages of the prior art.

To solve the problem stated in the above, the present application provides a square wave generating method, which can be applied in a square wave generating circuit, configured to generate a mimetic square wave signal. The square wave generating circuit has a specific breakdown voltage. The square wave generating method includes: generating a mimetic square wave signal has a first voltage during a first time interval by the square wave generating circuit; generating a mimetic square wave signal has a second voltage during a second time interval by the square wave generating circuit; and generating, by the square wave generating circuit, a mimetic square wave signal has a transient voltage during a transient interval between the first time interval and the second time interval, where the transient voltage is between the first voltage and the second voltage, and a first voltage difference between the first voltage and the second voltage is greater than the breakdown voltage.

In an embodiment, a second voltage difference between the first voltage and the transient voltage is equal to the breakdown voltage.

In an embodiment, a third voltage difference between the transient voltage and the second voltage is equal to the breakdown voltage.

In an embodiment, the first voltage difference between the first voltage and the second voltage is twice of the breakdown voltage.

In an embodiment, the transient voltage is a grounding voltage.

The present application further provides a square wave generating circuit, configured to generate a mimetic square wave signal. The square wave generating circuit has a breakdown voltage, and the square wave generating circuit includes a output terminal, configured to output the mimetic square wave signal; a first signal generating circuit, configured to configured to generate a first voltage during a first time interval; a second signal generating circuit, configured to generate a second voltage during a second time interval; a first switch, an end of the first switch is coupled to the first signal generating circuit, and another end of the first switch is coupled to the output terminal; and a second switch, an end of the second switch is coupled to the second signal generating circuit, and another end of the second switch is coupled to the output terminal; wherein the first signal generating circuit and the second signal generating circuit generates a transient voltage during a transient interval, the transient interval is between the first time interval and the second time interval; wherein during the first time interval, the first switch is conducted, the mimetic square wave signal is the first voltage; during the second time interval, the second switch is conducted, the mimetic square wave signal is the second voltage, during the transient interval, the first switch or the second switch is conducted; wherein a first voltage difference between the first voltage and the second voltage is greater than the breakdown voltage.

In an embodiment, the first switch is controlled by a first control signal, during the transient interval, the first switch is conducted, and the first switch delivers the transient voltage from the first signal generating circuit to the output terminal.

In an embodiment, the second switch is controlled by a second control signal, during the transient interval, the second switch is conducted, and the second switch delivers the transient voltage from the second signal generating circuit to the output terminal.

In an embodiment, the first switch is a first MOS transistor, a bulk of the first MOS transistor is coupled to a source of the first MOS transistor, the first MOS transistor is a P-type MOS transistor, the second switch is a second MOS transistor, a bulk of the second MOS transistor is coupled to a source of the second MOS transistor, and the second MOS transistor is a N-type MOS transistor.

In an embodiment, a gate of the first MOS transistor receives the first control signal, and a gate of the second MOS transistor is coupled to a ground terminal.

In an embodiment, a gate of the second MOS transistor receives the second control signal, and a gate of the first MOS transistor is coupled to a ground terminal.

In an embodiment, the first signal generating circuit generates a first output signal, an output high voltage level of the first output signal is a positive voltage, and an output low voltage level of the first output signal is a grounding voltage.

In an embodiment, the first signal generating circuit includes a first inverter, an output high voltage level of the first inverter is the positive voltage, and an output low voltage level of the first inverter is the grounding voltage.

In an embodiment, the first signal generating circuit generates the first voltage as the positive voltage during the first time interval, and generates the transient voltage as the grounding voltage during the transient interval.

In an embodiment, the second signal generating circuit generates a second output signal, an output high voltage level of the second output signal is a grounding voltage, an output low voltage level of the second output signal is a negative voltage.

In an embodiment, the second signal generating circuit includes a second inverter, an output high voltage level of the second inverter is the grounding voltage, and an output low voltage level of the second inverter is the negative voltage.

In an embodiment, the second signal generating circuit generates the second voltage as the negative voltage during the second time interval.

In an embodiment, the square wave generating circuit further includes a first protection unit and a second protection unit, the first protection unit is coupled between the first signal generating circuit and the first switch, and the second protection unit is coupled between the second signal generating circuit and the second switch.

In an embodiment, the first protection unit includes a first N-type transistor and a first P-type transistor, the first N-type transistor and the first P-type transistor are coupled to each other, the second protection unit includes a second N-type transistor and a second P-type transistor, and the second N-type transistor and the second P-type transistor are coupled to each other.

In an embodiment, a gate of the first N-type transistor receives a positive voltage, a gate of the first P-type transistor and a gate of the second N-type transistor are coupled to a ground terminal, and a gate of the second P-type transistor receives a negative voltage.

The square wave generating circuit provided by the present application outputs the transient voltage during the transient interval when the output signal of the square wave generating circuit is transitioned from the high voltage to the low voltage (or transitioned from the low voltage to the high voltage). The square wave generating circuit of the present application can be able to output the mimetic square wave signal with high voltage amplitude, and may be manufactured by the low breakdown voltage manufacturing process with the breakdown voltage less than the high voltage amplitude, which has advantages of reducing the production cost.

These and other objectives of the present application will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 1:
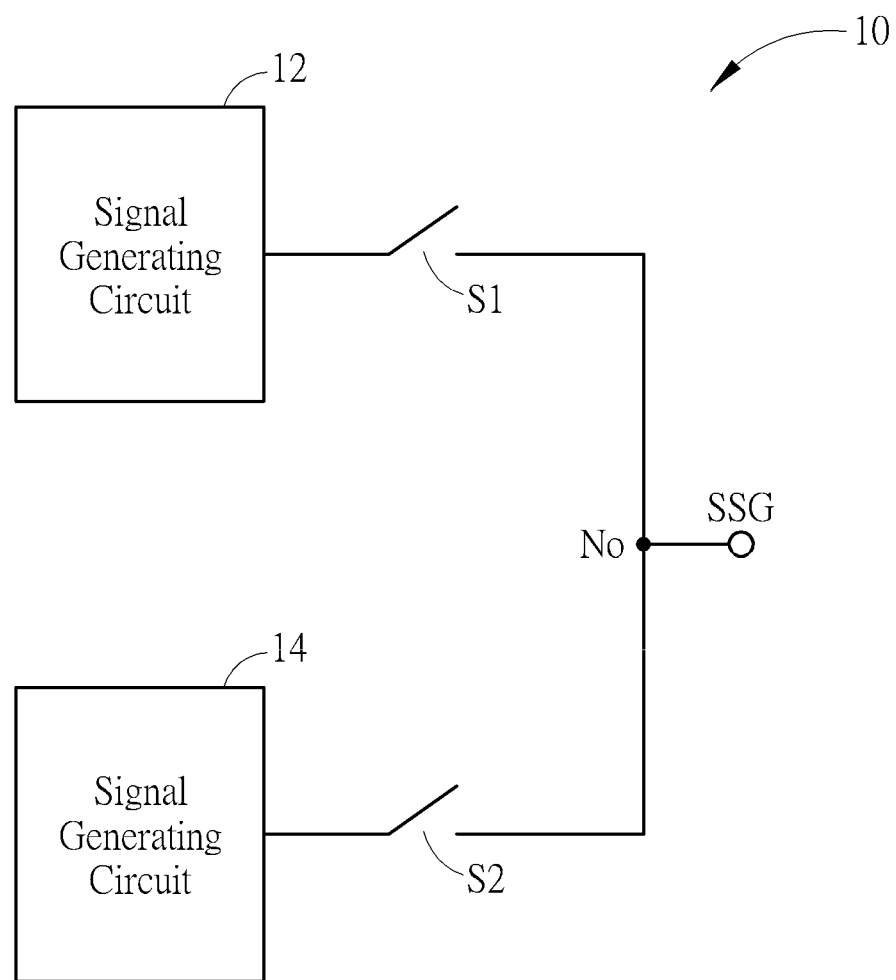
FIG. 1 is a schematic diagram of a square wave generating circuit according to an embodiment of the present application.
Figure 2:
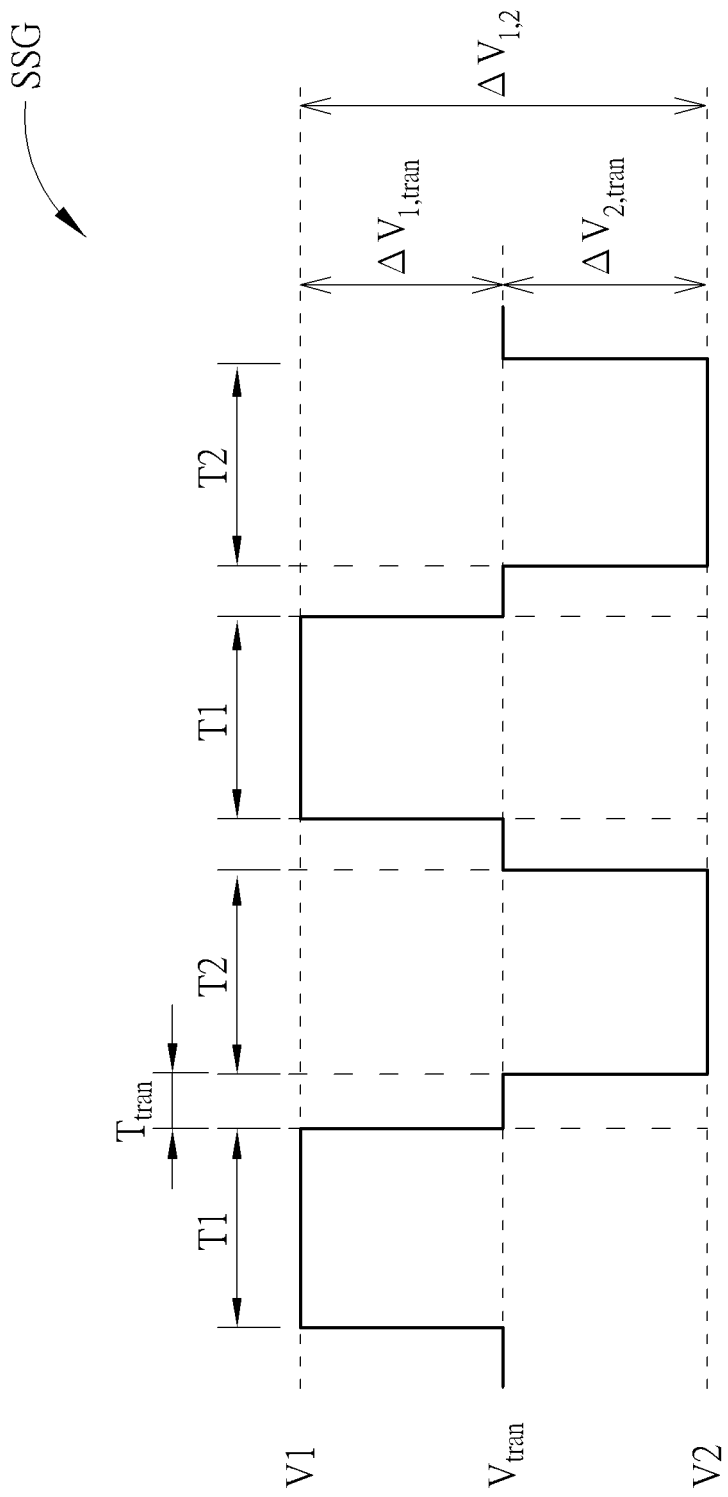
FIG. 2 is a schematic diagram of a mimetic square wave signal according to an embodiment of the present application.

Please refer to FIG. 1 and FIG. 2. FIG. 1 is a schematic diagram of a square wave generating circuit 10 according to an embodiment of the present application. FIG. 2 is a schematic diagram of a mimetic square wave signal SSG according to an embodiment of the present application. As shown in FIG. 2, the mimetic square wave signal SSG has a high voltage V1 during a time interval T1, has a low voltage V2 during a time interval T2, and has a transient voltage $V_{tran}$ during a transient interval $T_{tran}$, where the transient voltage $V_{tran}$ is less than the high voltage V1 and greater than the low voltage V2. A voltage difference $\Delta V_{1,2}$ is formed between the high voltage V1 and the low voltage V2. A voltage difference $\Delta V_{1,tran}$ is formed between the high voltage V1 and the transient voltage $V_{tran}$. A voltage difference $\Delta V_{2,tran}$ is formed between the transient voltage $V_{tran}$ and the low voltage V2. In addition, the transient interval $T_{tran}$ is between the time interval T1 and the time interval T2. When the transient interval $T_{tran}$ is small compared to the time interval T1 or the time interval T2 (e.g., when $T_{tran} < T1*(1/100)$ or $T_{tran} < T2*(1/100)$), the mimetic square wave signal SSG may approach a square wave signal, that is why it is called the mimetic square wave signal. In another perspective, the square wave generating circuit 10 is manufactured by a specific manufacturing process along with a specific breakdown voltage BV. In other words, when an overall voltage difference of the square wave generating circuit 10 is more than the specific breakdown voltage BV, semiconductor components within the square wave generating circuit 10 would breakdown, and the square wave generating circuit 10 is damaged. Under a condition of the square wave generating circuit 10 having the specific breakdown voltage BV, the square wave generating circuit 10 is able to generate the mimetic square wave signal SSG where the voltage difference $\Delta V_{1,2}$ is greater than the specific breakdown voltage BV.

In another perspective, as shown in FIG. 1, the square wave generating circuit 10 includes an output terminal No, signal generating circuits 12, 14 and switches S1, S2. The output terminal No is configured to output the mimetic square wave signal SSG. The signal generating circuit 12 is configured to generate the high voltage V1 during the time interval T1, and generate the transient voltage $V_{tran}$ during the transient interval $T_{tran}$. The signal generating circuit 12 is configured to generate the low voltage V2 during the time interval T2. The switch S1 and the switch S2 are coupled between the signal generating circuit 12 and the output terminal No and between the signal generating circuit 14 and the output terminal No, respectively. In an embodiment, the switch S1 may be conducted during the time interval T1 and the transient interval $T_{tran}$, and be cutoff during the time interval T2. In addition, the switch S2 may be cutoff during the time interval T1 and the transient interval $T_{tran}$, and be conducted during the time interval T2. Therefore, the output terminal No may output the mimetic square wave signal SSG having the high voltage V1 during the time interval T1, output the mimetic square wave signal SSG having the transient voltage $V_{tran}$ during the transient interval $T_{tran}$, and output the mimetic square wave signal SSG having the low voltage V2 during the time interval T2. In other words, the square wave generating circuit 10 utilizes the transient interval $T_{tran}$ in which the transition is from the high voltage V1 to the low voltage V2 (or from the low voltage V2 to the high voltage V1) to output the transient voltage $V_{tran}$, so as to avoid that the overall voltage difference is suddenly over the specific breakdown voltage BV. Therefore, even though the voltage difference $\Delta V_{1,2}$ between the high voltage V1 and the low voltage V2 of the mimetic square wave signal SSG is greater than the specific breakdown voltage BV, the square wave generating circuit 10 is still able to operate normally, and would not be damaged because of breakdown.

In an embodiment, the voltage difference $\Delta V_{1,tran}$ between the high voltage V1 and the transient voltage $V_{tran}$ may be a voltage VDD, the voltage difference $\Delta V_{2,tran}$ between the transient voltage $V_{tran}$ and the low voltage V2 may also be the voltage VDD, and the voltage difference $\Delta V_{1,2}$ between the high voltage V1 and the low voltage V2 may achieve twice of the voltage VDD. Furthermore, in an embodiment, the voltage difference $\Delta V_{1,tran}$ between the high voltage V1 and the transient voltage $V_{tran}$ may be the specific breakdown voltage BV, the voltage difference $\Delta V_{2,tran}$ between the transient voltage $V_{tran}$ and the low voltage V2 may also be the specific breakdown voltage BV, and the voltage difference $\Delta V_{1,2}$ between the high voltage V1 and the low voltage V2 may achieve twice of the specific breakdown voltage BV.

Figure 3:
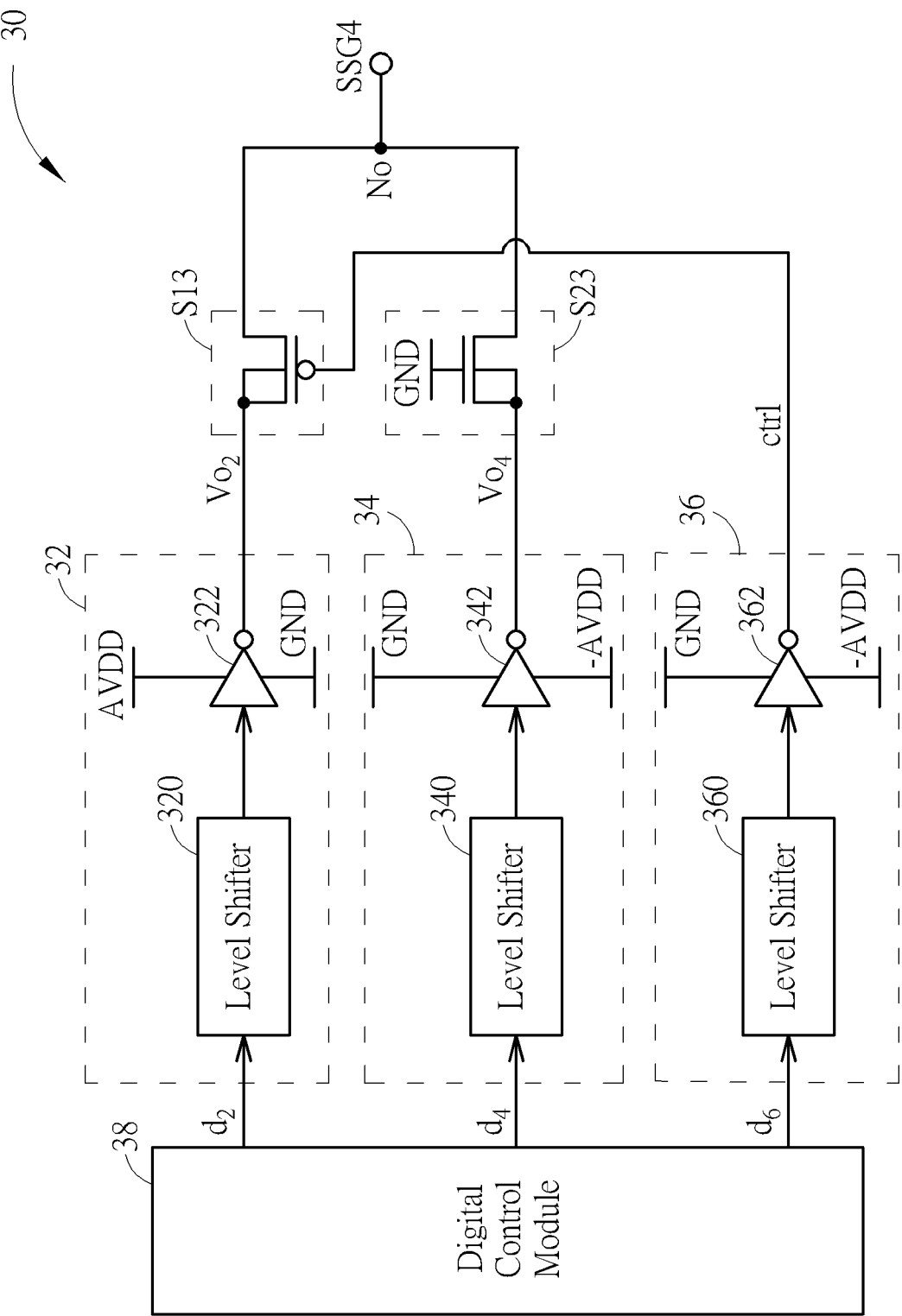
FIG. 3 is a schematic diagram of a square wave generating circuit according to an embodiment of the present application.

Refer to FIG. 3 to see details of the square wave generating circuit 10. FIG. 3 is a schematic diagram of a square wave generating circuit 30 according to an embodiment of the present application. The square wave generating circuit 30 includes the output terminal No, signal generating circuits 32, 34, 36, switches S13, S23 and a digital control module 38. The signal generating circuits 32, 34 are configured to realize the signal generating circuits 12, 14 in FIG. 1, respectively. The switches S13, S23 are configured to realize the switches S1, S2 in FIG. 1, respectively. The signal generating circuit 36 may generate a control signal ctrl to control a conduction status of the switch S13. Specifically, the signal generating circuit 32 includes a level shifter 320 and an inverter 322. The signal generating circuit 34 includes a level shifter 340 and an inverter 342. The signal generating circuit 36 includes a level shifter 360 and an inverter 362. An output voltage level of the inverter 322 is between a positive voltage AVDD and a grounding voltage GND, i.e., the inverter 322 operates between the positive voltage AVDD and the grounding voltage GND. The output voltage levels of the inverters 342, 362 are between the grounding voltage GND and a negative voltage −AVDD, i.e., the inverters 342, 362 operate between the grounding voltage GND and the negative voltage −AVDD. In other words, an output signal $Vo_2$ outputted by the inverter 322 has an output high voltage level as the positive voltage AVDD, and the output signal $Vo_2$ has an output low voltage level as the grounding voltage GND. An output signal $Vo_4$ outputted by the inverter 342 has an output high voltage level as the grounding voltage GND, and the output signal $Vo_4$ has an output low voltage level as the negative voltage −AVDD. The control signal ctrl outputted by the inverter 362 has an output high voltage level as the grounding voltage GND, and the control signal ctrl has an output low voltage level as the negative voltage −AVDD. In addition, the digital control module 38 generates digital signals $d_2$, $d_4$, $d_6$, configured to control the inverters 322, 342, 362, respectively. The level shifters 320, 340, 360 are configured to convert the digital signals outputted by the digital control module 38 into the input high voltage levels (herein voltage are also called (voltage) level) or input low voltage levels for controlling the inverters 322, 342 and 362. In addition, the square wave generating circuit 30 may be manufactured by a low breakdown voltage manufacturing process, where the low breakdown voltage manufacturing process is referred to a semiconductor manufacturing process with the breakdown voltage BV lower than the amplitude of the square wave. In addition, the breakdown voltage BV may a little bit higher than the voltage AVDD.

In addition, the switch S13 may be a P-type MOS transistor (Metal Oxide Semiconductor Field Effect Transistor), and the switch S23 may be an N-type MOS transistor. The bulks of the switch S13 and the switch S23 are coupled to the sources thereof. The source of the switch S13 is coupled to the output terminal of the inverter 322, and the source of the switch S23 is coupled to the output terminal of the inverter 342, so as to receive an output signal $Vo_2$ and an output signal $Vo_4$, respectively. Drains of the switch S13 and the switch S23 are coupled to the output terminal No. In addition, the gate of the switch S13 is coupled to the output terminal of the inverter 362 to receive the control signal ctrl, and the gate of the switch S23 receives the grounding voltage GND.

Figure 4:
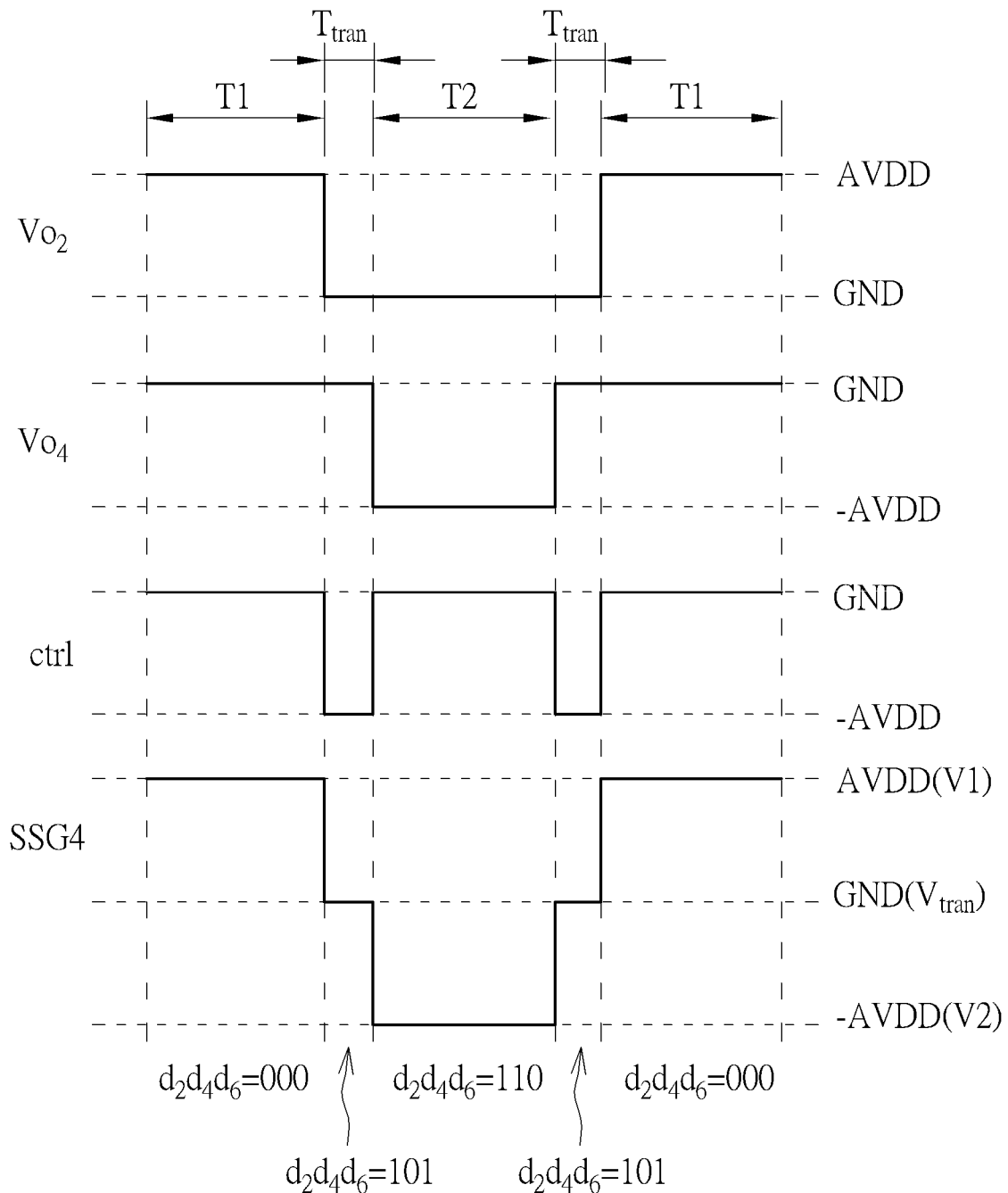
FIG. 4 is a waveform diagram of a plurality of signals according to an embodiment of the present application.

Operations of the square wave generating circuit 30 are described as follows. Please refer to FIG. 4. FIG. 4 is a waveform diagram of the output signals $Vo_2$, $Vo_4$ and the control signal ctrl generated by the square wave generating circuit 30. During the time interval T1, the digital control module 38 generates the digital signals $d_2$, $d_4$, $d_6$ to be 0, 0, 0, respectively (i.e., $d_2d_4d_6$=000). The inverter 322 outputs the output signal $Vo_2$ as the positive voltage AVDD, the inverter 342 outputs the output signal $Vo_4$ as the grounding voltage GND, and the inverter 362 outputs the control signal ctrl as the grounding voltage GND. The switch S13 is conducted and the switch S23 is cutoff. Thus, the square wave generating circuit 30 may output the high voltage V1 to be the positive voltage AVDD during the time interval T1. In addition, during the transient interval $T_{tran}$, the digital control module 38 generates the digital signals $d_2$, $d_4$, $d_6$ to be 1, 0, 1, respectively (i.e., $d_2d_4d_6$=101). The inverter 322 outputs the output signal $Vo_2$ which is the grounding voltage GND, the inverter 342 outputs the output signal $Vo_4$ which is the grounding voltage GND, the inverter 362 outputs the control signal ctrl which is the negative voltage −AVDD. The switch S13 is still conducted and the switch S23 is still cutoff. Thus, the square wave generating circuit 30 may output the transient voltage $V_{tran}$ as the grounding voltage GND during the transient interval $T_{tran}$. In addition, during the time interval T2, the digital control module 38 generates the digital signals $d_2$, $d_4$, $d_6$ to be 1, 1, 0, respectively (i.e., $d_2d_4d_6$=110). At this time, the inverter 322 outputs the output signal $Vo_2$ which is the grounding voltage GND, the inverter 342 outputs the output signal $Vo_4$ as the negative voltage −AVDD, and the inverter 362 outputs the control signal ctrl as the grounding voltage GND. The switch S13 is cutoff and the switch S23 is conducted. Thus, the square wave generating circuit 30 may output the low voltage V2 to be the negative voltage −AVDD during the time interval T2. And so on and so forth, the square wave generating circuit 30 may generate a mimetic square wave signal SSG4 as illustrated in FIG. 4. Therefore, the voltage difference $\Delta V_{1,tran}$ between the high voltage V1 (the positive voltage AVDD) and the transient voltage $V_{tran}$ (the grounding voltage GND), of the mimetic square wave signal SSG4 may be the voltage AVDD, the voltage difference $\Delta V_{2,tran}$ between the transient voltage $V_{tran}$ (the grounding voltage GND) and the low voltage V2 (the negative voltage −AVDD), may also be the voltage AVDD, such that the voltage difference $\Delta V_{1,2}$ between the high voltage V1 and the low voltage V2 may achieve twice of the voltage AVDD, which is greater than the specific breakdown voltage BV.

In short, the square wave generating circuit 30 utilizes the transient interval $T_{tran}$ between the time interval T1 and the time interval T2 to transition the output voltage, at the output terminal No within the square wave generating circuit 30, from the high voltage V1 to the transient voltage $V_{tran}$, and then to transition the output voltage from the transient voltage $V_{tran}$ to the low voltage V2 (or, alternatively, to transition from the low voltage V2 to the transient voltage $V_{tran}$ and then to transition from the transient voltage $V_{tran}$ to the high voltage V1). Therefore, under a condition of the specific breakdown voltage BV of the square wave generating circuit 30 being a little bit higher than the voltage AVDD, the square wave generating circuit 30 may generate the mimetic square wave signal SSG4 with the amplitude of 2*AVDD, without damaging the internal components of the square wave generating circuit 30 because of breakdown.

Figure 5:
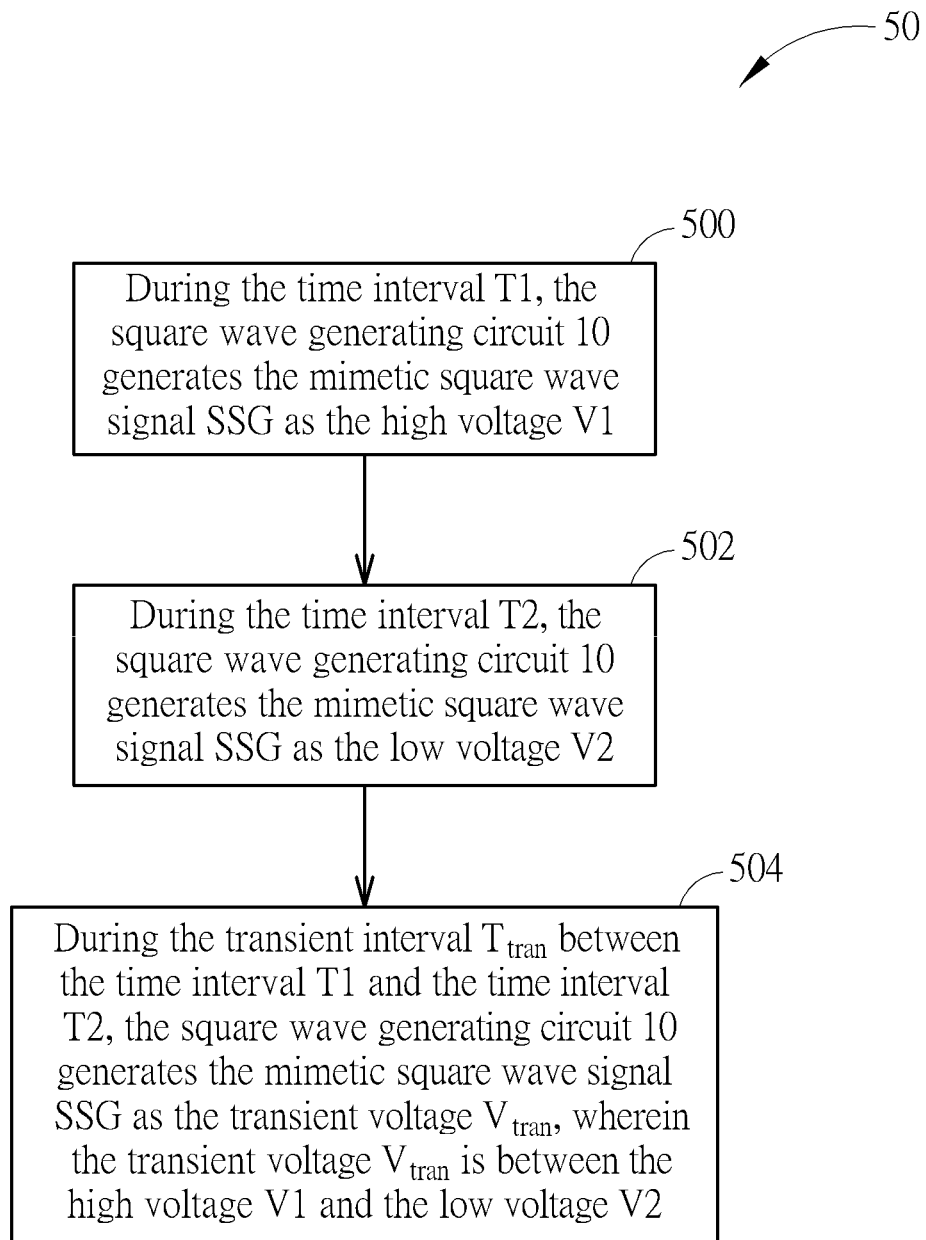
FIG. 5 is a schematic diagram of a square wave generating process according to an embodiment of the present application.

The operations of the square wave generating circuit 10 generating the mimetic square wave signal SSG may be further summarized as a square wave generating process. Please refer to FIG. 5. FIG. 5 is a schematic diagram of a square wave generating process 50 according to an embodiment of the present application. The square wave generating process 50 may be executed by the square wave generating circuit 10 in FIG. 1, which includes the following steps:

Step 500: During the time interval T1, the square wave generating circuit 10 generates the mimetic square wave signal SSG as the high voltage V1.

Step 502: During the time interval T2, the square wave generating circuit 10 generates the mimetic square wave signal SSG as the low voltage V2.

Step 502: During the transient interval $T_{tran}$ between the time interval T1 and the time interval T2, the square wave generating circuit 10 generates the mimetic square wave signal SSG as the transient voltage $V_{tran}$, wherein the transient voltage $V_{tran}$ is between the high voltage V1 and the low voltage V2.

Details of the square wave generating process 50 are referred to the paragraph in the above, which is not narrated herein for brevity.

As can be seen from the above, the square wave generating circuit of the present application may be manufactured by the low breakdown voltage semiconductor manufacturing process, and is able to output the (mimetic) square wave signal with high voltage amplitude. For example, the square wave generating circuit of the present application may utilize the low breakdown voltage manufacturing process with the breakdown voltage BV as 5 volts, and is still able to output the square wave signal with high voltage amplitude greater than 5 volts (e.g., 10 volts). In other words, when a circuit system require the square wave signal with high voltage amplitude (e.g., 10 volts), the square wave generating circuit of the present application may avoid the high production cost brought by the high breakdown voltage semiconductor manufacturing process, and be manufactured by the low breakdown voltage semiconductor manufacturing process (e.g., the low breakdown voltage semiconductor manufacturing process within the breakdown voltage BV as 5 volts may be used). Therefore, the present application may reduce the production cost if the overall circuit system, and may achieve the same effect.

Figure 6:
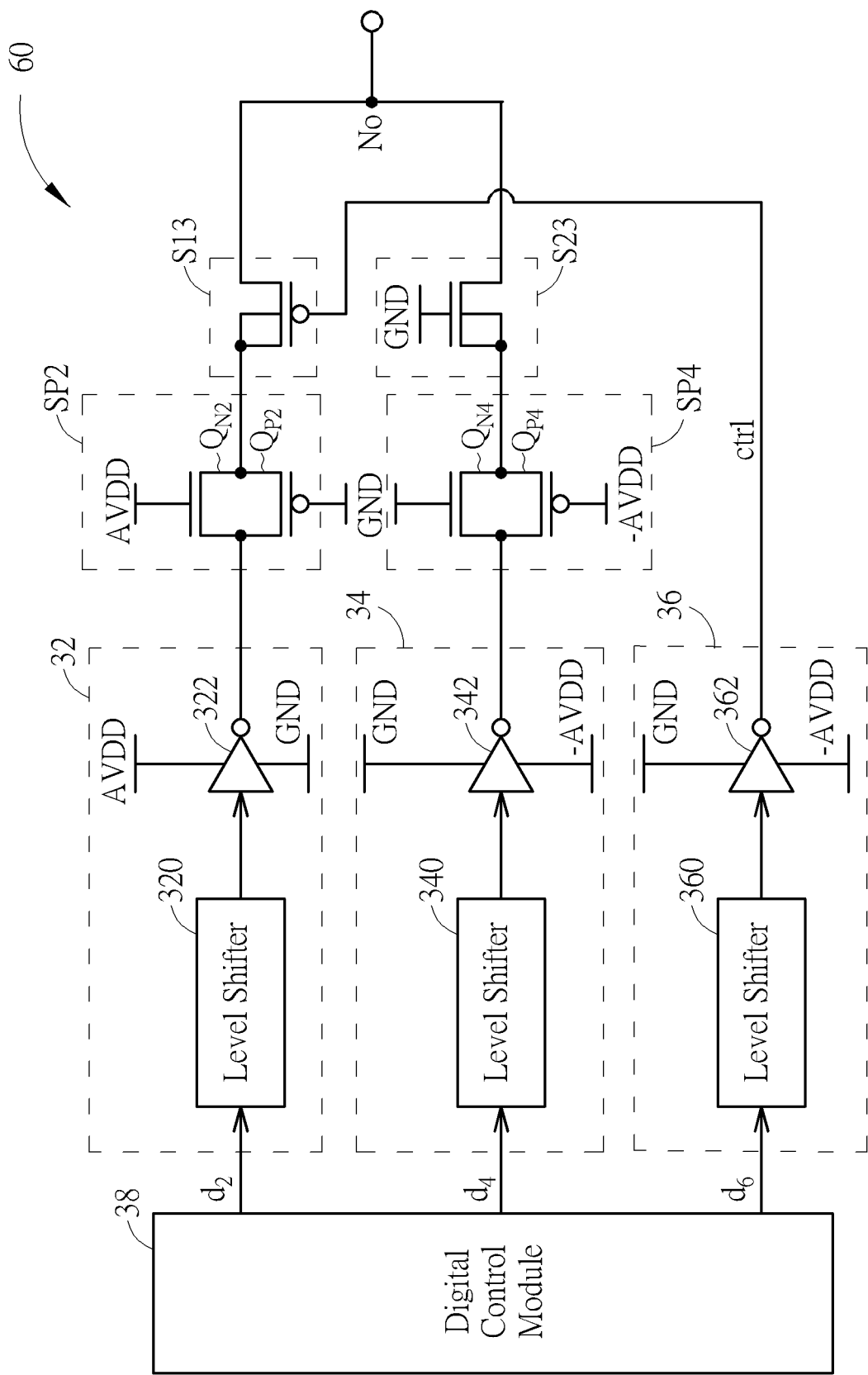
FIG. 6 is a schematic diagram of a square wave generating circuit according to another embodiment of the present application.

Notably, the embodiments stated in the above are utilized for illustrating the concept of the present application. Those skilled in the art may make modifications and alterations accordingly, and not limited herein. For example, please refer to FIG. 6. FIG. 6 is a schematic diagram of the square wave generating circuit 60 according to another embodiment of the present application. The square wave generating circuit 60 is similar to the square wave generating circuit 30, and thus, the same components are denoted by the same notations. Different from the square wave generating circuit 30, the square wave generating circuit 60 further includes protection units SP2 and SP4. The protection unit SP2 is coupled between the inverter 322 and the switch S13. The protection unit SP2 includes a P-type MOS transistor $Q_{P2}$ and an N-type MOS transistor $Q_{N2}$. The transistor $Q_{N2}$ and the transistor $Q_{P2}$ are coupled to each other. The gate of the transistor $Q_{N2}$ receives the positive voltage AVDD, and the gate of the transistor $Q_{P2}$ receives the grounding voltage GND. In addition, the protection unit SP4 between coupled to the inverter 342 and the switch S23. The protection unit SP4 includes a P-type MOS transistor $Q_{P4}$ and an N-type MOS transistor $Q_{N4}$. The transistor $Q_{N4}$ and the transistor $Q_{P4}$ are coupled to each other. The gate of the transistor $Q_{N4}$ receives the grounding voltage GND, and the gate of the transistor $Q_{P4}$ receives the negative voltage −AVDD. The protection units SP2, SP4 may be configured to protect the switches S13 and S23, to avoid the switches S13 and S23 from damage.

Figure 7:
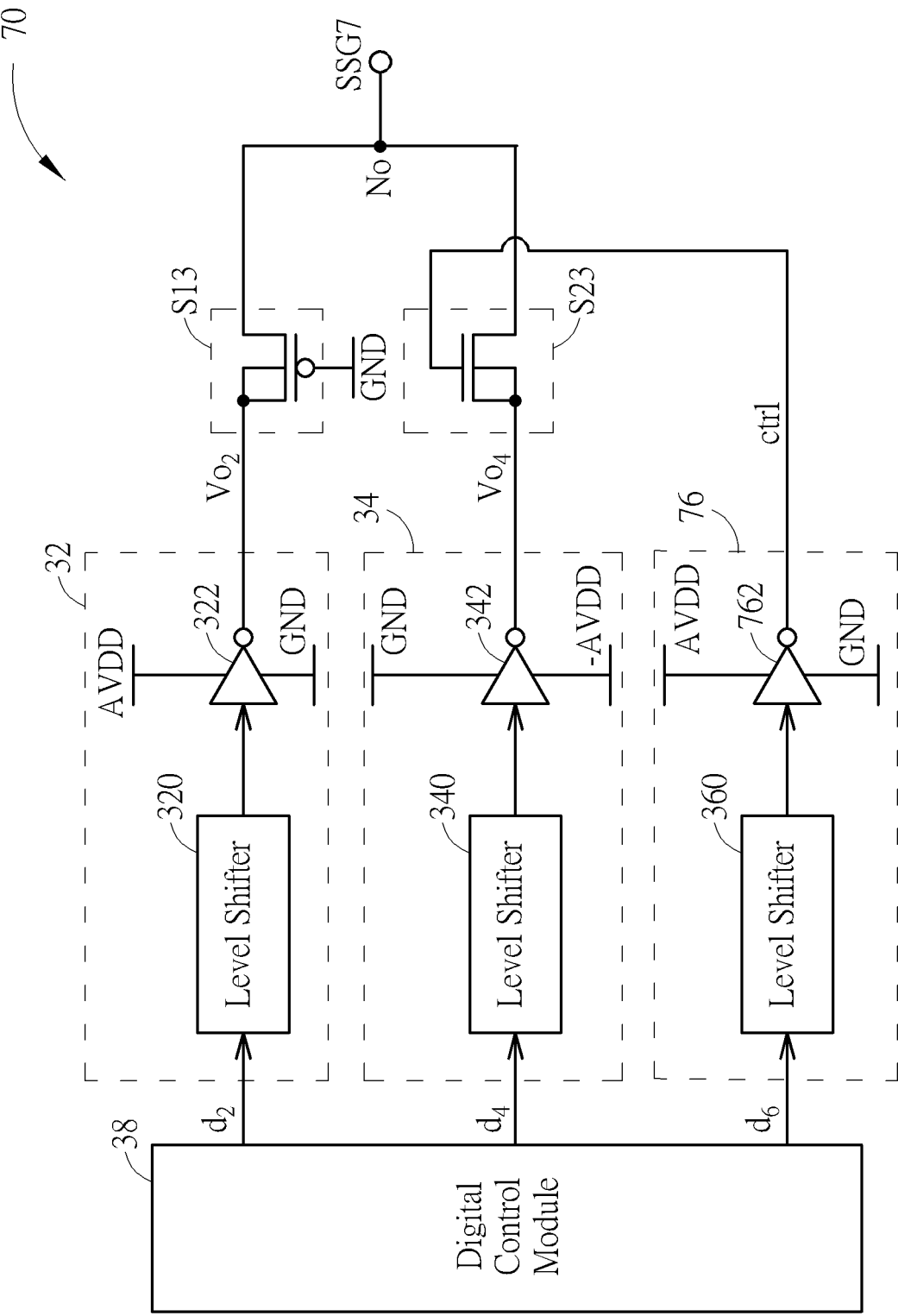
FIG. 7 is a schematic diagram of a square wave generating circuit according to another embodiment of the present application.
Figure 8:
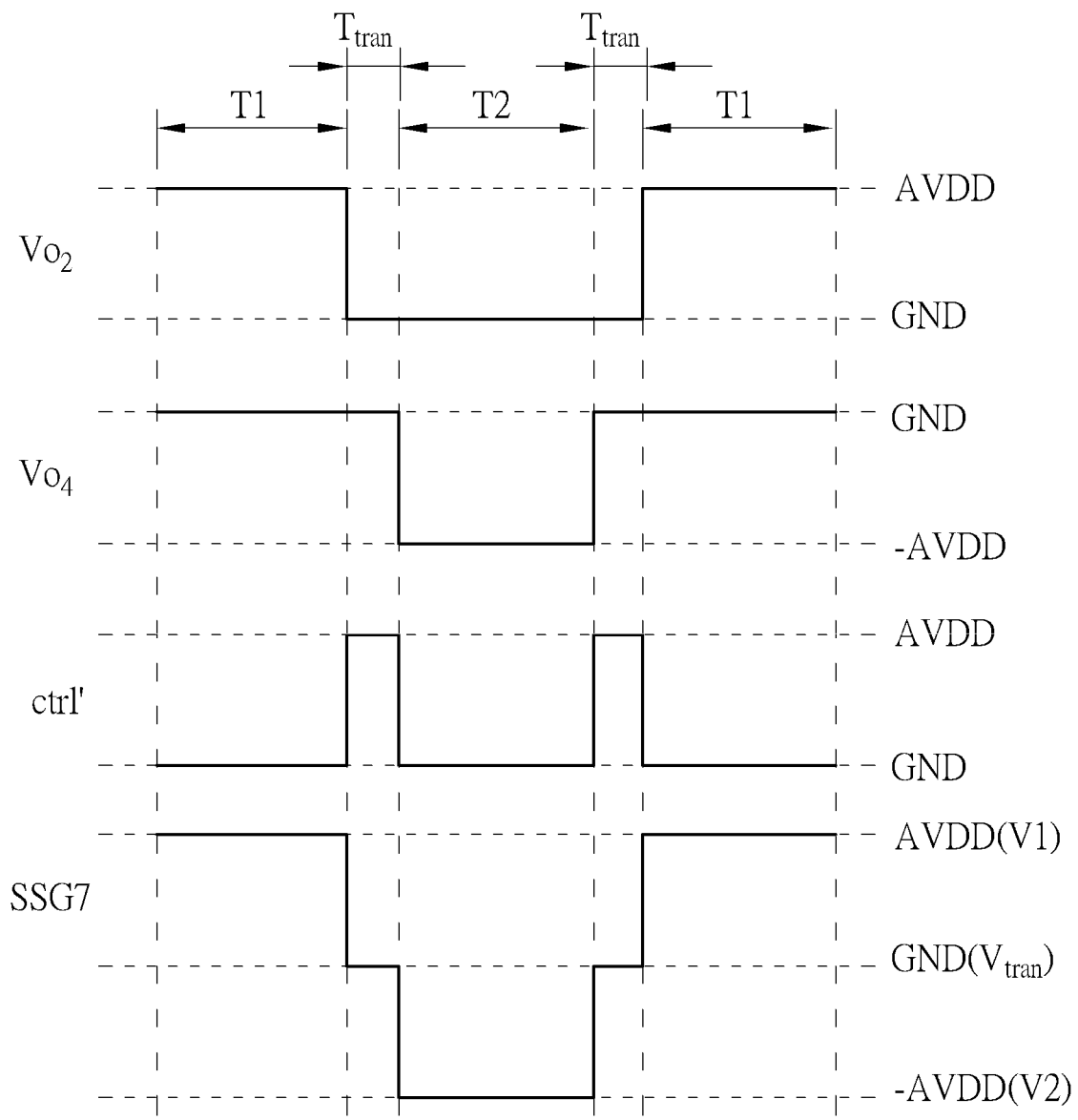
FIG. 8 is a waveform diagram of a plurality signals corresponding to the square wave generating circuit if FIG. 7.

In addition, please refer to FIG. 7 and FIG. 8. FIG. 7 is a schematic diagram of a square wave generating circuit 70 according to another embodiment of the present application. FIG. 8 is a waveform diagram of the output signals $Vo_2$, $Vo_4$ and a control signal ctrl' generated by the square wave generating circuit 70. The square wave generating circuit 70 is similar to the square wave generating circuit 30, and thus, the same components are denoted by the same notations. Different from the square wave generating circuit 30, the gate of the switch S13 (which is the P-type MOS transistor) in the square wave generating circuit 70 receives the grounding voltage GND, and the gate of the switch S23 (which is the N-type MOS transistor) in the square wave generating circuit 70 receives the control signal ctrl'. The control signal ctrl' is generated by a signal generating circuit 76. The signal generating circuit 76 includes an inverter 762. The output voltage level of the inverter 762 is between the positive voltage AVDD and the grounding voltage GND.

Operations of the square wave generating circuit 70 are similar to which of the square wave generating circuit 30, which is narrated as follows. During the time interval T1, the inverter 762 outputs the control signal ctrl as the grounding voltage GND. The switch S13 is conducted and the switch S23 is cutoff. Thus, the square wave generating circuit 70 may output a mimetic square wave signal SSG7 as the positive voltage AVDD during the time interval T1. During the transient interval $T_{tran}$, the inverter 322 outputs the output signal $Vo_2$ as the grounding voltage GND. The switch S13 is cutoff. The inverter 362 outputs the control signal ctrl as the positive voltage AVDD. The switch S23 is conducted. The square wave generating circuit 70 may output the mimetic square wave signal SSG7 as the grounding voltage GND during the transient interval $T_{tran}$. In addition, during the time interval T2, the inverter 322 outputs the output signal $Vo_2$ as the grounding voltage GND. The switch S13 is still cutoff. The inverter 762 outputs the control signal ctrl as the grounding voltage GND. The switch S23 is conducted, the square wave generating circuit 70 may output the mimetic square wave signal SSG7 as the negative voltage −AVDD during the time interval T2.

Figure 9:
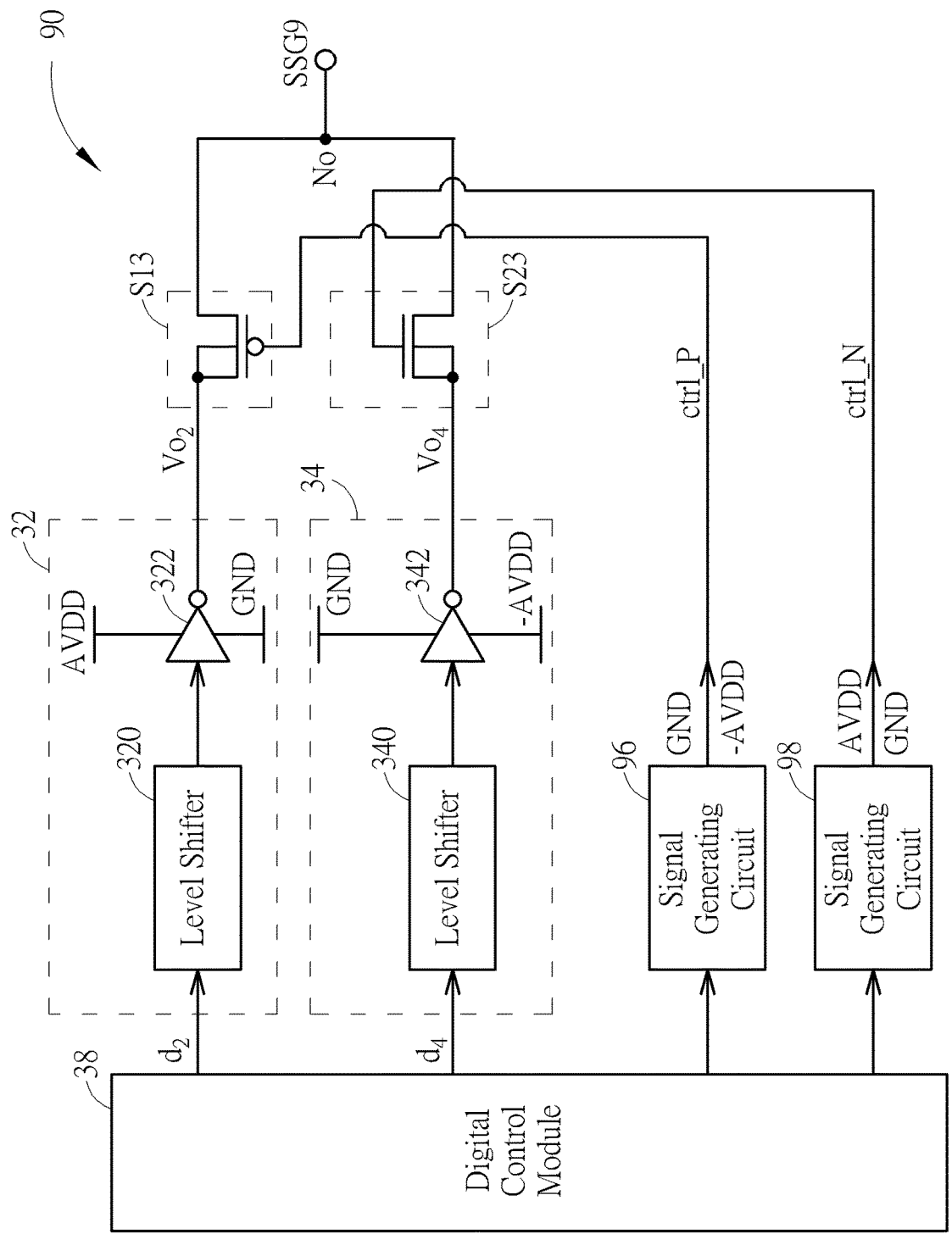
FIG. 9 is a schematic diagram of a square wave generating circuit according to another embodiment of the present application.

In addition, please refer to FIG. 9. FIG. 9 is a schematic diagram of a square wave generating circuit 90 according to another embodiment of the present application. The square wave generating circuit 90 is similar to the square wave generating circuits 30 and 70, and thus, the same components are denoted by the same notations. Different from the square wave generating circuits 30 and 70, the square wave generating circuit 90 includes signal generating circuits 96 and 98. The signal generating circuits 96 and 98 are configured to generate the control signals ctrl_P and ctrl_N, so as to control the conduction statuses of the switches S13 and S23, respectively. Moreover, a voltage range of the control signal ctrl_P is between the grounding voltage GND and the negative voltage −AVDD, a voltage range of the control signal ctrl_N is between the positive voltage AVDD and the grounding voltage GND. Operations of the square wave generating circuit 90 is similar to which of the square wave generating circuits 30 and 70, which are not narrated herein for brevity.

Figure 10:
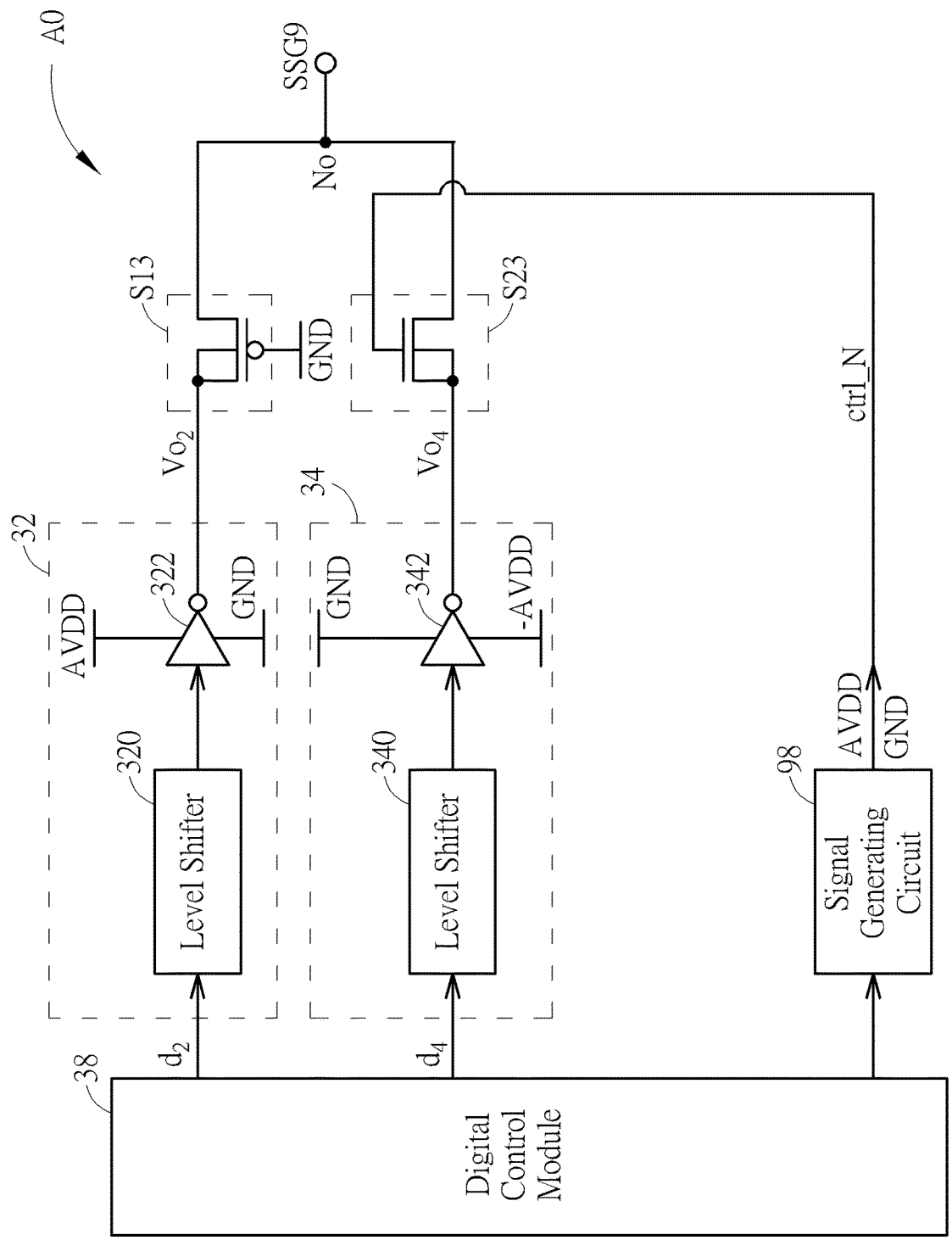
FIG. 10 is a schematic diagram of a square wave generating circuit according to another embodiment of the present application.

In addition, please refer to FIG. 10. FIG. 10 is a schematic diagram of a square wave generating circuit AO according to another embodiment of the present application. The square wave generating circuit AO is similar to the square wave generating circuit 90, and thus, the same components are denoted by the same notations. the square wave generating circuit AO includes the signal generating circuit 98 only, to control the conduction status of the switch S23, and the gate of the switch S13 receives the grounding voltage GND. Operations of the square wave generating circuit AO is similar to which of the square wave generating circuit 90, which are not narrated herein for brevity.

In addition, the voltage difference $\Delta V_{1,tran}$ between the high voltage V1 and the transient voltage $V_{tran}$ is not limited to be the specific breakdown voltage BV. The voltage difference $\Delta V_{1,tran}$ between the high voltage V1 and the transient voltage $V_{tran}$ may be less than the specific breakdown voltage BV. Similarly, the voltage difference $\Delta V_{2,tran}$ between the transient voltage $V_{tran}$ and the low voltage V2 may also be less than the specific breakdown voltage BV. As long as the voltage difference $\Delta V_{1,2}$ between the high voltage V1 and the low voltage V2 is greater than the specific breakdown voltage BV of the square wave generating circuit 10, requirements of the present application are satisfied.

In addition, it is not limited to use the inverter to generate the high voltage V1, the transient voltage $V_{tran}$ and the low voltage V2 in the signal generating circuit. Buffers may be used to generate the high voltage V1, the transient voltage $V_{tran}$ and the low voltage V2, wherein the buffer may include two inverters connected to each other, which is also within the scope of the present application.

In summary, the present application inserts the transient interval and outputs the transient voltage when the output signal of the square wave generating circuit is transitioned from the high voltage to the low voltage (or transitioned from the low voltage to the high voltage). Therefore, the square wave generating circuit of the present application may output the mimetic square wave signal which is similar to the square wave and has the high voltage amplitude, and can be manufactured by the low breakdown voltage manufacturing process with the breakdown voltage less than the high voltage amplitude, such that the production cost is reduced.

The foregoing is only embodiments of the present application, which is not intended to limit the present application. Any modification following the spirit and principle of the present application, equivalent substitutions, improvements should be included within the scope of the present application.

What is claimed is:

1. A square wave generating method, applied in a square wave generating circuit, configured to generate a mimetic square wave signal, wherein the square wave generating circuit has a breakdown voltage and comprises a first signal generating circuit, a second signal generating circuit, a first switch and a second switch, wherein the square wave generating method comprises:
   generating, by the first signal generating circuit, a first pulse comprising a first voltage during a first time interval, such that the mimetic square wave signal comprises the first pulse at the first time interval;
   generating, by the second signal generating circuit, a second pulse comprising a second voltage during a second time interval, such that the mimetic square wave signal comprises the second pulse at the second time interval; and
   generating, by the square wave generating circuit, the mimetic square wave signal comprising a transient voltage during a transient interval between the first time interval and the second time interval, wherein the transient voltage is between the first voltage and the second voltage;
   wherein a first polarity of the first pulse and a second polarity of the second pulse are opposite;
   wherein a first voltage difference is formed between the first voltage and the second voltage, and the first voltage difference is greater than the specific breakdown voltage;
   wherein the first switch comprises a first MOS transistor comprising a first gate and the second switch comprises a second MOS transistor comprising a second gate;
   wherein the first gate and the second gate are not connected.

2. The square wave generating method of claim 1, wherein a second voltage difference between the first voltage and the transient voltage is equal to the breakdown voltage, or a third voltage difference between the transient voltage and the second voltage is equal to the breakdown voltage.

3. The square wave generating method of claim 1, wherein the first voltage difference is twice of the breakdown voltage.

4. The square wave generating method of claim 1, wherein the transient voltage is a grounding voltage.

5. A square wave generating circuit, configured to generate a mimetic square wave signal, wherein the square wave generating circuit has a breakdown voltage, wherein the square wave generating circuit comprises:
an output terminal, configured to output the mimetic square wave signal;
a first signal generating circuit, configured to generate a first pulse comprising a first voltage during a first time interval;
a second signal generating circuit, configured to generate a second pulse comprising a second voltage during a second time interval;
a first switch, one end of the first switch coupled to the first signal generating circuit, and another end of the first switch coupled to the output terminal; and
a second switch, one end of the second switch coupled to the second signal generating circuit, and another end of the second switch coupled to the output terminal;
wherein the first signal generating circuit and the second signal generating circuit generate a transient voltage during a transient interval, the transient interval is between the first time interval and the second time interval;
wherein, the first switch is conducted during the first time interval, such that the mimetic square wave signal comprises the first pulse at the first time interval; the second switch is conducted during the second time interval, such that the mimetic square wave signal comprises the second pulse at the second time interval; the first switch or the second switch is conducted during the transient interval;
wherein a first polarity of the first pulse and a second polarity of the second pulse are opposite;
wherein a first voltage difference between the first voltage and the second voltage is greater than the breakdown voltage;
wherein the first switch comprises a first MOS transistor comprising a first gate and the second switch comprises a second MOS transistor comprising a second gate;
wherein the first gate and the second gate are not connected.

6. The square wave generating circuit of claim 5, wherein the first switch is controlled by a first control signal, during the transient interval, the first switch is conducted, and the first switch delivers the transient voltage from the first signal generating circuit to the output terminal.

7. The square wave generating circuit of claim 5, wherein the second switch is controlled by a second control signal, during the transient interval, the second switch is conducted, and the second switch delivers the transient voltage from the second signal generating circuit to the output terminal.

8. The square wave generating circuit of claim 5, wherein a bulk of the first MOS transistor is coupled to a source of the first MOS transistor, the first MOS transistor is a P-type MOS transistor, a bulk of the second MOS transistor is coupled to a source of the second MOS transistor, the second MOS transistor is a N-type MOS transistor.

9. The square wave generating circuit of claim 8, wherein the first gate of the first MOS transistor receives a first control signal, the second gate of the second MOS transistor is coupled to a ground terminal; or the second gate of the second MOS transistor receives a second control signal, the first gate of the first MOS transistor is coupled to a ground terminal.

10. The square wave generating circuit of claim 5, wherein the first signal generating circuit generates a first output signal, an output high voltage level of the first output signal is a positive voltage, and an output low voltage level of the first output signal is a grounding voltage.

11. The square wave generating circuit of claim 10, wherein the first signal generating circuit comprises a first inverter, an output high voltage level of the first inverter is the positive voltage, and an output low voltage level of the first inverter is the grounding voltage.

12. The square wave generating circuit of claim 10, wherein the first signal generating circuit generates the first voltage as the positive voltage during the first time interval, and generates the transient voltage as the grounding voltage during the transient interval.

13. The square wave generating circuit of claim 5, wherein the second signal generating circuit generates a second output signal, an output high voltage level of the second output signal is a grounding voltage, an output low voltage level of the second output signal is a negative voltage.

14. The square wave generating circuit of claim 13, wherein the second signal generating circuit comprises a second inverter, an output high voltage level of the second inverter is the grounding voltage, an output low voltage level of the second inverter is the negative voltage.

15. The square wave generating circuit of claim 13, wherein the second signal generating circuit generates the second voltage as the negative voltage during the second time interval.

16. The square wave generating circuit of claim 5, wherein a second voltage difference between the first voltage and the transient voltage is equal to the breakdown voltage; or a third voltage difference between the transient voltage and the second voltage is equal to the breakdown voltage.

17. The square wave generating circuit of claim 5, wherein the first voltage difference between the first voltage and the second voltage is twice of the breakdown voltage.

18. The square wave generating circuit of claim 5, further comprising a first protection unit and a second protection unit, wherein the first protection unit is coupled between the first signal generating circuit and the first switch, and the second protection unit is coupled between the second signal generating circuit and the second switch.

19. The square wave generating circuit of claim 18, wherein the first protection unit comprises a first N-type transistor and a first P-type transistor, the first N-type transistor and the first P-type transistor are coupled to each other, the second protection unit comprises a second N-type transistor and a second P-type transistor, and the second N-type transistor and the second P-type transistor are coupled to each other.

20. The square wave generating circuit of claim 19, wherein a gate of the first N-type transistor receives a positive voltage, a gate of the first P-type transistor and a gate of the second N-type transistor are coupled to a ground terminal, a gate of the second P-type transistor receives a negative voltage.

* * * * *